United States Patent [19]

Hendrickson

[11] 3,769,590

[45] Oct. 30, 1973

[54] VARACTOR TUNER DRIVER CIRCUIT

[75] Inventor: Melvin C. Hendrickson, Elmhurst, Ill.

[73] Assignee: Zenith Radio Corporation, Chicago, Ill.

[22] Filed: June 12, 1972

[21] Appl. No.: 261,845

[52] U.S. Cl. .................. 325/459, 325/465, 325/468, 334/15

[51] Int. Cl. .................. H04b 1/16

[58] Field of Search .................. 325/459, 465, 464, 325/468; 334/14, 15

[56] References Cited

UNITED STATES PATENTS

| | | | |
|---|---|---|---|
| 3,662,270 | 5/1972 | Evans | 325/459 X |
| 3,654,557 | 4/1972 | Sakamoto et al. | 334/15 X |
| 3,522,542 | 8/1970 | Labude et al. | 325/465 X |
| 3,602,822 | 8/1971 | Evans et al. | 325/464 |

*Primary Examiner*—Benedict V. Safourek
*Attorney*—Nicholas A. Camasto et al.

[57] ABSTRACT

A varactor driver circuit in a television receiver for providing a varactor tuner with unique control voltages representative of particular broadcast channels selected by the viewer. The varactor driver circuit utilizes first, second and third sets of electrically isolated conductors arranged in a matrix configuration physically defining individual broadcast channels. Each one of a first set of conductors defines a range of broadcast channels (e.g., channels 20–29) while each of the second conductors together with an associated one of the third conductors defines individual channels (e.g., channel 0, 2, 12 . . . , 82) within the defined ranges. Physically identical plug-in modules each comprising an adjustable voltage divider network, are insertable into the multiple receptacles so defined by the three sets of conductors, each receptacle identifying a unique broadcast channel. A switching arrangement selectively couples the first conductor corresponding to the range of the desired broadcast channel to the varactor tuner. The switching arrangement further couples the second conductor corresponding to the particular channel in that range to a plane of reference potential (B+) while simultaneously coupling the corresponding third conductor to ground. Accordingly, a potential is applied across the voltage divider network, and a control voltage unique to that particular broadcast channel is coupled through the first conductor to the varactor tuner.

8 Claims, 4 Drawing Figures

VARACTOR TUNER DRIVER CIRCUIT

BACKGROUND OF THE INVENTION

This invention relates in general to a multi-band wave signal tuning arrangement and in particular to a varactor driver circuit for a combined VHF-UHF varactor tuner in a television receiver.

Television receivers marketed in the U.S. today are required to have a tuner arrangement capable of receiving 12 VHF channels and 70 UHF channels. Until recently this requirement could be met with a 13-position tuning apparatus in which 12 of the positions are allocated to VHF channels and selected by a switch or turret-type tuner while a desired one of the 70 UHF channels is selected by adjusting a separate continuous-type tuner which is activated when the tuning apparatus is positioned to the 13th or UHF position. However, in order to comply with regulations recently adopted by the Federal Communications Commission, the tuning apparatus for a domestic television receiver will have to afford the viewer "equalized" tuning in the VHF and UHF bands. Stated simply, this requirement means that the tuning arrangement must be so designed as to enable the viewer to select, with equal ease, a VHF channel or a UHF channel. In fact, it is desirable that the viewer need know only the channel number, without regard to UHF or VHF bands.

In the past, the manner in which VHF and UHF channels were selected posed no significant problems since the 13-position detent-type tuner was not only practical but acceptable. It would then seem that the obvious solution to the "equalized" tuning requirement would be to provide a UHF tuner with a detent or stop for each UHF channel. While such a detent arrangement is obtainable, it is neither feasible nor practical in view of the attendant complex mechanical and switching mechanisms required to accommodate the 70 channel assignments in the UHF frequency spectrum. The relatively recent development of voltage-controlled (varactor) tuners has eliminated most of the mechanical difficulties associated with providing an "equal ease" detent-type tuner for television receivers.

A varactor tuner generally includes a voltage-variable capacitance diode, or varactor diode, in each of its tunable resonant circuits for capacitively tuning the receiver to different channels responsive to changes in the amplitude of a DC control or tuning voltage applied to the varactor diodes. As the tuner is actuated to different channel positions, the control voltage level is varied to change the resonant frequency of each tunable circuit in order to effect tuning to different channels. Thus, the complex mechanical and switching mechanisms heretofore required by conventional television tuners can be replaced by tuned resonant circuits utilizing varactor diodes. Accordingly, channel selection arrangements have been devised whereby a first control knob selects one of several decade ranges of television channels while an additional knob selects a particular channel within that decade range. Even so, to provide a circuit capable of deriving the 82 discrete control voltages required to tune the varactor tuner to any one of the corresponding 82 channels has been a truly formidable task. Most designers of television receivers, recognizing that only a few channels are actually utilized within any given broadcast reception area, have provided for the selection of only a certain number of predetermined channels, usually 12 VHF and 6 UHF.

Further, the increasing reliance on cable television (CATV) systems for providing additional channels of personal service information, e.g., education, stock market quotations, localized weather reports, etc., makes it highly desirable to provide a tuning arrangement capable of receiving and selecting such channels with "equal ease."

SUMMARY OF THE INVENTION

Accordingly, it is an object of the invention to provide a multi-band varactor tuning arrangement with a new and improved varactor driver circuit providing for "equal ease" selection of any channel within the several broadcast bands.

A more particular object of the invention is to provide a new and improved varactor driver circuit for a multi-band varactor tuning arrangement which satisfied the Federal Communications Commission requirements for "equalized" tuning of a television receiver over the VHF and UHF frequency bands.

A further object of the invention is to provide a multi-band varactor tuning arrangement with a new and improved varactor driver circuit which develops a different unique voltage level for every channel to which the arrangement may be tuned.

Another object of the invention is to provide a new and improved varactor driver circuit for a multi-band varactor tuning arrangement that provides for the preselection of any number of channels and that is considerably easier to set-up than previous varactor tuners, requiring no special channel display installation.

It is also an object of the invention to provide a multi-band varactor tuning arrangement with a new and improved varactor driver circuit which can be expanded to accommodate any number of CATV channels, providing "equal ease" tuning thereof.

In accordance with the present invention, an improved varactor driver circuit is included for applying a control voltage representative of a particular selected broadcast channel to the VHF and UHF varactor tuners of a color television receiver. In a preferred embodiment, the varactor driver circuit includes a mechanical matrix means comprising multiple receptacles for electrically and physically defining several ranges of individual braodcast channels. Several plug-in means, each insertable into one of the multiple receptacles, determine control voltages representative of the particular broadcast channels corresponding to the respective receptacles. Switch means are also provided for selectively coupling a desired receptacle and its corresponding control voltage to the varactor tuning system. Exact channel read-out means coupled to the switch means identifies the particular broadcast channel selected by the switch means.

BRIEF DESCRIPTION OF THE DRAWINGS

The features of the present invention which are believed to be novel are set forth with particularity in the appended claims. The invention, together with its further objects and advantages thereof, may best be understood by reference to the following description taken in conjunction with the accompanying drawings, and in which like reference numerals refer to like elements in the several figures and in which:

PREFERRED EMBODIMENT OF THE INVENTION

Television tuners at present must be capable of selecting any one of 12 VHF channels divided into two non-adjacent frequency bands. In accordance with the transmission standards existing in the United States, the first five channels (designated channels two–six) fall within the "low" VHF band which extends from 54 to 88 mHz, while the remaining seven channels (designated channels seven–13) occupy the "high" VHF band which extends from 172 to 216 mHz. Each channel extends over a bandwidth of 6 mHz, and the channels within each band are uniformly spaced. Television signals are also transmitted over 70 channels in the UHF band which covers the frequency spectrum between 470–890 mHz. Furthermore, provision should also be made to accommodate the additional channels which are likely to result due to the increased popularity of and the anticipated reliance on cable television (CATV) systems for various personal in-home services, e.g., banking, education, etc. It will be shown that applicant's invention provides an all-channel "equal ease" television tuner which covers the UHF band as well as the "low" and "high" VHF bands and thus is capable of selecting any one of 82 channels, while providing for the future utilization of CATV channels.

Figure 1:
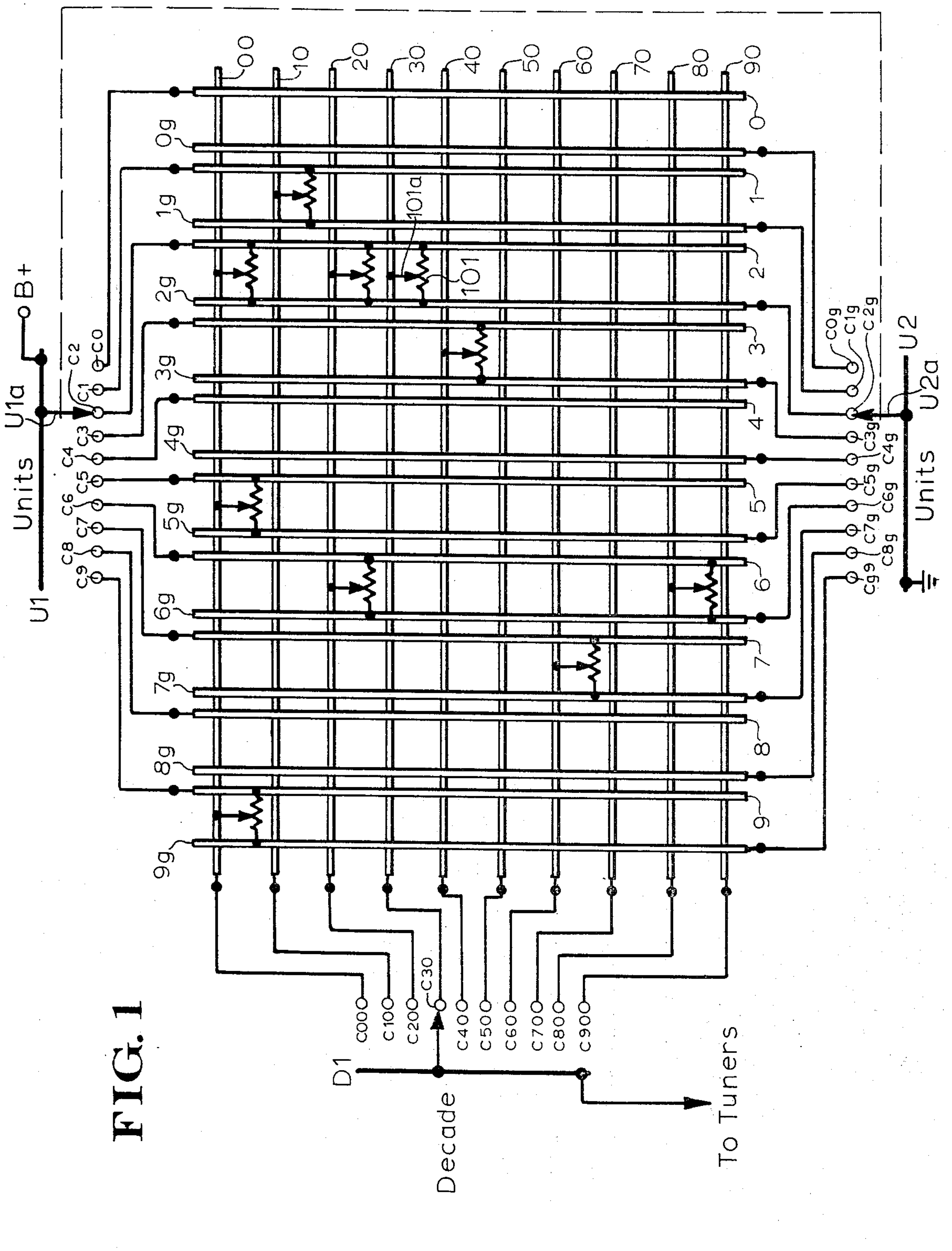
FIG. 1 is a schematic diagram of the portion of a multi-band varactor tuning arrangement for a television receiver comprising the varactor driver circuit.

Turning now to FIG. 1, there is shown a varactor driver circuit for developing a control voltage representative of a particular broadcast channel that the viewer has selected and for applying that voltage to VHF and UHF tuners of the varactor type.

The varactor driver circuit of the present invention comprises a multiplicity of electrically conductive elements, or conductors, arranged in a grid-type matrix array to physically define a number of individual broadcast channels by means of a coordinate system. That is, a first set of conductive elements comprising "*n*" conductors, denoted 00, 10, . . . n0, is arranged in parallel rows (herein shown to be vertical) to define ranges comprising ten individual channels. Although for purposes of illustration only 10 such "range" conductors are shown, it should be understood that the number of ranges provided is limited only by the number of available broadcast channels in the frequency spectrum assigned to television broadcasts by the Federal Communications Commission. Second and third sets of electrical conductors arranged perpendicularly to the "range" conductors define individual channels within the ranges. These "channel" conductors are arranged in parallel pairs, each conductor in the second set, i.e., 0, 1, . . . ,9, being alternately interspersed with corresponding conductors in the third set, i.e., $\mathbf{0}_g$, $\mathbf{1}_g$, . . . ,$\mathbf{9}_g$, from top to bottom across the "range" conductors. Alternatively the system may have the functions of the first set of conductors interchanged with that of the second and third sets, and achieve the same results. Accordingly, any particular channel may be identified and located by reference to the coordinate system defined by the three sets of electrical conductors. For example, "range" conductor 30 defines channels 30–39, inclusively, while "channel" conductor 2 and its corresponding conductor $\mathbf{2}_g$ narrow the range to define channel 32. In the present embodiment of the invention any of 100 individual broadcast channels may be so identified.

The individual conductors comprising the three sets of conductive elements are not electrically interconnected. Each conductor 00, 10, . . , 90, in the first set, however, is connected to the corresponding contact c00, c10, . . . c90, of a 10-position single pole "decade" switch D1 while the second conductors 0, 1, . . . 9, are connected to the corresponding contacts c0, c1, . . . , c9, of a 10-position single pole "unit" switch U1. A source of reference potential (B+) is selectively coupled through the wiper arm U1a to a desired one of the second conductor set (e.g., shown in FIG. 1 as a conductor 2). A second 10-position single pole, "unit" switch U2 couples the third conductors $\mathbf{0}_g$, $\mathbf{1}_g$, . . . ,$\mathbf{9}_g$, to ground through its wiper arm U2a which is ganged with "unit" switch U1 and operable from the same control knob. This is indicated by the dashed line joining wiper arms U1a and U2a. Thus, although switch U2 is electrically independent of switch U1, their wiper arms U2a and U1a, respectively, are simultaneously switched to corresponding contact positions. Accordingly, whenever "unit" switch U1 is switched to the contact corresponding to a particular channel, such as channel 32, B+ potential is applied to conductor 2 and its like corresponding conductor $\mathbf{2}_g$ is coupled to ground.

To obtain a control voltage representative of a particular channel, the wiper arm 101*a* of a potentiometer 101 is connected to the conductor in the first set of conductive elements corresponding to the range in which the desired channel is located. The potentiometer 101 is itself coupled between the second conductor representative of the particular channel within the range and the corresponding third conductor. Accordingly, when the viewer wishes to select a particular channel (e.g., channel 32) the "decade" switch D1 is manually adjusted to the contact c30 which corresponds to the "range" conductor 30 representing channels 30–39. The "unit" switch U1 selects the desired channel (32) within that range by applying the B+ reference potential through contact c2 to conductor 2 while simultaneously adjusting "unit" switch U2 to connect the corresponding third conductor $\mathbf{2}_g$ to ground. Proper adjustment of wiper arm 101*a* insures that a control voltage corresponding to that particular channel selected by the viewer will be coupled to the corresponding "range" conductor. In turn, the control voltage is coupled through "decade" switch D1 and an AFC network 102 to the VHF and UHF tuners 103 and 104, respectively, shown in FIG. 2.

Although the B+ potential may be applied across more than one potentiometer if the second conductor and the corresponding third conductor define more than one individual active channel (e.g., channels 2, 22, 32 in FIG. 1), only the particular control voltage selected by the corresponding "range" conductor (30) representative of the desired channel (32) will be coupled to the VHF and UHF tuners 103, 104. Similarly, even though more than one wiper arm 101*a* may be connected to a particular "range" conductor, (e.g., conductor 30) only one potentiometer 101 will have the B+ potential applied thereacross. All of the other potentiometers 101 will be electrically isolated from the B+ potential and ground. Thus, any number of potentiometers 101 may be similarly positioned on the coordinate system defined by the three sets of conductive elements.

Figure 2:
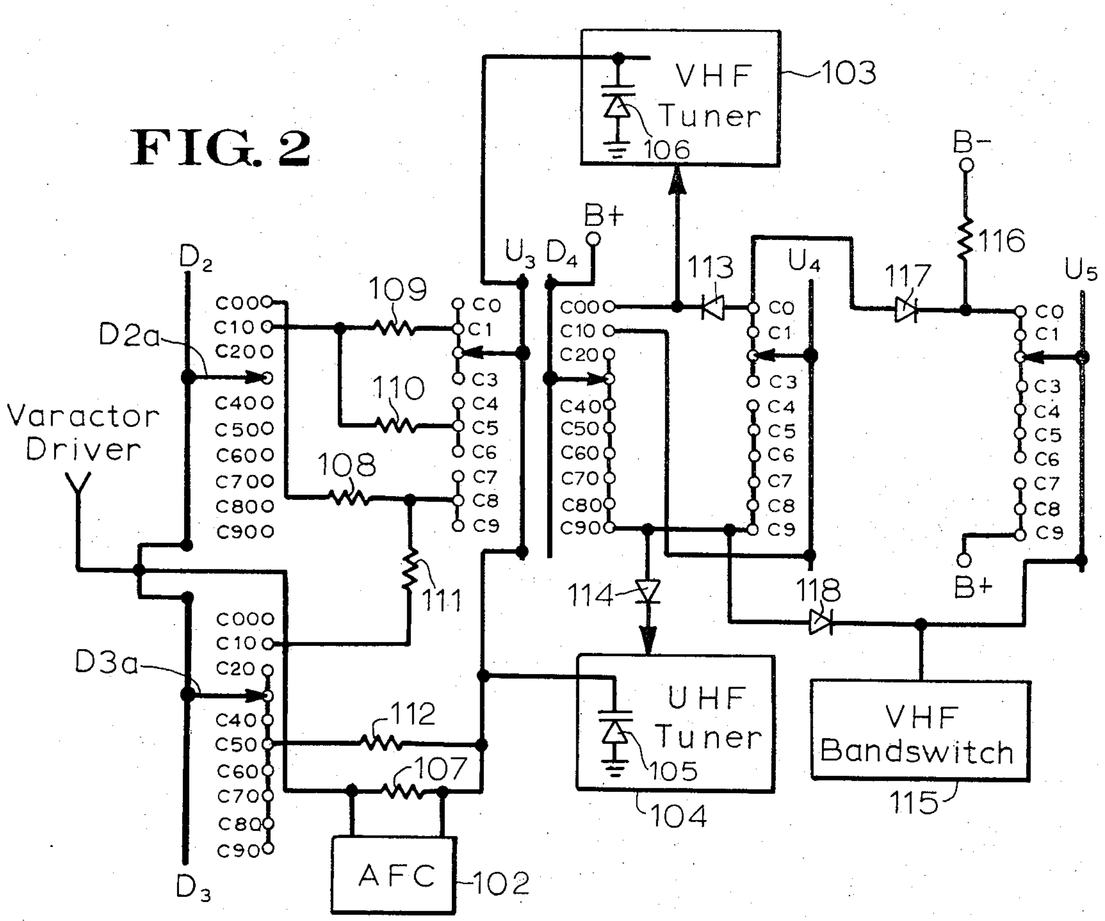
FIG. 2 is a combined schematic and block diagram of the tuner selection and band-switching circuitry associated with the varactor driver circuit.

As previously mentioned, once the control voltage is derived from the varactor driver circuit, it is applied through an AFC network 102, shown in FIG. 2, to the varactor diodes 105 and 106 of the VHF and UHF tuners 103 and 104, respectively. More particularly, the control voltage is partially coupled through a resistor 107, connected in parallel with the AFC network 102, to add an AFC correction voltage to the control voltage from the varactor driver circuit thereby insuring that the VHF and UHF tuners 103, 104 are correctly fine-tuned to the desired broadcast channel. However, a different AFC sensitivity is required for each frequency band, i.e., low VHF (channels 2–6), high VHF (channels 7–13) and UHF (channels 14–83), and accordingly, the equivalent resistance connected in parallel with the AFC network 102 must be of a different value for each band. In the present embodiment illustrated in FIG. 2, this is achieved by including a switchable, resistive network which selectively parallels additional resistors across resistor 107. The resistive network comprises three additional switches U3, D2 and D3 selectively interconnected by various resistors which they, in turn, parallel across resistor 107. Switches D2 and D3 are coupled to one end of resistor 107 while switch U3 is connected to the other end of resistor 107. Switches D2, D3 and switch U3 are ganged with switch D1 and switches U1, U2, respectively, and are operable from their respective control knobs. It is quickly apparent from FIG. 2 that several resistors interconnect some contacts of switches D2, D3 and contacts of switch U3 to parallel resistor 107 in certain instances.

Thus, for channels 2–6 in the low VHF band, switches D2 and D3 are positioned at their c00 contacts while switch U3 is selectively moved to one of its contacts c2–c6. However, the c00 contact of switch D3 is left unconnected and the c00 contacts of switch D3 is not coupled to any of the contacts c2–c6 of switch U3. Thus, there is an open circuit in the parallel resistive network, and resistor 107 alone determines the AFC sensitivity. For part of the high VHF band, more particularly channels 7–9, a resistor 108 couples the c00 contact of switch D2 to the interconnected c7–c9 contacts of switch U3 such that resistor 108 effectively parallels resistor 107 modifying the sensitivity of the AFC network 102. Whenever a channel (10–13) in the remainder of the high VHF band is selected, the wiper arm D2a and D3a of switches D2 and D3, respectively, are repositioned at their c10 contact and switch U3 will be moved to any of its electrically interconnected c0–c3 contacts. Accordingly, a resistor 109 coupled between contact c10 of switch D2 and contact c1 of switch U3 will be placed in parallel with resistor 107. The impedance of resistor 109 is identical to that of resistor 108; thus, the AFC sensitivity is constant over the entire high VHF band. For the portion of the UHF band comprising channels 14–16, a resistor 110 connects contact c10 of switch D2 to the c4–c6 contacts of switch U3, paralleling resistor 107. A resistor 111 having the same impedance as resistor 110 is coupled between contacts c10 of switch D3 and the c7–c9 contacts of switch U3 for channels 17–19. Still another resistor, 112, couples the interconnected c20–c90 contacts of switch D3 directly to the opposite end of resistor 107 to vary the AFC sensitivity. It should be apparent that similar switching arrangements may be devised to define channels 84–99 which may be allocated to CATV channels.

As noted previously, the control voltage from the varactor driver circuit is coupled to both the VHF tuner 103 and the UHF tuner 104. Accordingly, there is provided still another switching arrangement comprising switches D4 and U4, electrically independent of the other two arrangements but mechanically dependent thereon, to activate the proper tuner depending on which channel is selected by applying the B+ potential only to that tuner. Thus, whenever the viewer selects channels 2–9, the B+ potential applied to switch D4 is coupled through its c00 contact to the VHF tuner 103, applying operating potential thereto. A diode 113 isolates the c00 contact from the remainder of the switching arrangement. For the rest of the high VHF band (channels 10–13), switch D4 connects the B+ potential through its c10 contact to switch U4 which, in turn, applies it to its interconnected contacts c0–c3. The B+ potential is then applied through diode 113 to the VHF tuner 103. If any one of channels 14–19 is selected, however, the B+ potential coupled to switch U4 is applied to the UHF tuner 104 through a diode 114 connected to the c4–c9 contacts of switch U4. Accordingly, the B+ potential applied to the UHF tuner 104 activates it while the VHF tuner 103 is deactivated because there is no longer any operating potential applied to it. The interconnection of switch D4's contacts c20–c90 and diode 114 couples the B+ potential to the UHF tuner 104 whenever any remaining channel in the UHF frequency band is selected.

As is the case when more than one frequency band is to be covered, a band-switching arrangement must be provided to suitably vary the inductances associated with the tunable resonant circuits of the varactor tuners. Thus, each tunable circuit includes a sectionalized inductance coil (not shown) with different sections being shorted out responsive to the band switch 115.

In the present embodiment, band switching is accomplished by utilization of an additional switch U5, operable from the control knob of "unit" switch U1. Thus, when the tuner activation arrangement applies B+ potential to the VHF tuner 103 in response to the selection of any one of channels 2–6, a negative source of reference potential (B−) is coupled through resistor 116 to the c0–c6 contacts of switch U5. Switch U5 further transmits the B− potential to the band switch 115 to condition the tuner for reception of channels in the low VHF band. Diodes 117 and 118 prevent the transmission of the B+ potential back to the tuner selection arrangement, while diode 113 insures that B+ potential is not applied to the band switch 115. During reception of high VHF channels, however, a positive potential (B+) must be applied to the band switch 115. Thus, whenever any one of channels 7–9 is selected, the B+ potential is connected directly to the c7–c9 contacts of switch U5 which couples it to the bandswitch 115. For channels 10–13, which comprise the remainder of the high VHF band, B+ potential is applied to switch D4 and coupled form its contact C10 to the c0–c3 contacts of switch U4. The B+ potential is then passed by diode 117 to the interconnected contacts c0–c6 of switch U5 and on to the band switch 115. When, however, the view selects any of channels 14–19, the B+ potential is applied through switch D4 to the interconnected contacts c4–c9 of switch U4 which is, in turn, coupled to the band switch 115 by diode 118. For channels 20–83, the B+ potential is directly coupled from any of the c20–c90 contacts of switch D4 through diode 118 to the band switch 115.

Figure 3:
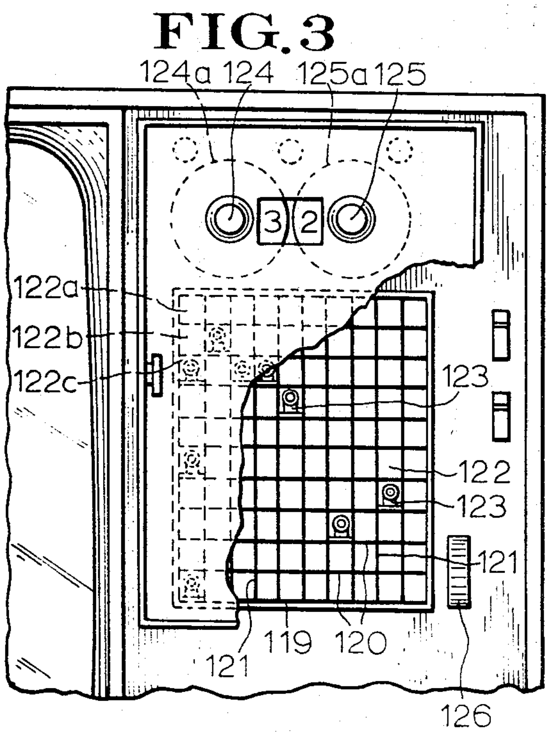
FIG. 3 is an elevated frontal view of the portion of a television receiver embodying the multi-band varactor tuning arrangement and the varactor driver circuit of the present invention.

Referring now to FIG. 3, an embodiment of the present invention is shown there illustrating the control panel of a television receiver incorporating the varactor driver circuit and its associated varactor tuning arrangement previously described. The control panel includes a grid-like structure 119, similar in many respects to an egg crate. That is, plastic horizontal and vertical support members 120 and 121, respectively, combine to form open-ended rectangular receptacles 122 arranged in a grid, or matrix array, physically identified with broadcast channels. Thus, any particular channel may be identified by means of the resultant coordinate system. For example, the upper lefthand receptacle 122*a* of the grid defines channel 00, while receptacle 122*b* immediately below it defines channel 01 and the twice-removed receptacle 122*c* represents channel 02. As noted previously, regarding the varactor driver's electrical characteristics (FIG. 1), in any one downward-extending row there are 10 such receptacles which define a "decade" range of channels, e.g., channels 0–9, 10–19, etc. Any number of downward-extending rows may be provided to define as many channels as is practical.

Each receptacle 122, in turn, accommodates a plug-in module 123 housing potentiometer 101 of FIG. 1. Although each of the 90 receptacles shown in FIG. 3 can be provided with its own module which, in turn, is tuned to its corresponding channel, any lesser number of modules may be used equally effectively.

Any desired channel may be selected by positioning two control knobs, each independently of the other. The "decade" control knob 124 and the "unit" control knob 125 have numbers embossed on their skirts 124*a*, 125*a*, which, when read through a slot, provide an exact-channel read-out of the broadcast channel to which the receiver has been tuned. In FIG. 3, for example, channel 32 has been selected. The "decade" control knob 124 and the "unit" control knob 125 adjust switches D1–D4 and U1–U5, respectively, such that the desired channel is selected, the corresponding tuner is activated, and the required bandswitching is accomplished. Accordingly, any one of the receptacles 122 in which a module has been installed and adjusted may be addressed by means of the control knobs to obtain a control voltage representative of the corresponding channel. The resulting voltage may then be applied to the varactor tuners.

A coarse-adjustment tuning meter 126 is also provided for aiding in properly setting-up, or adjusting the potentiometer 101 (not shown) to provide a control voltage corresponding to the channel receptacle 122 in which the plug-in module 123 is located. Thus, if it is desired to set up channel 32, a module 123 is inserted into the corresponding receptacle 122 on the grid, the control knobs are set to 32, and the potentiometer 101 is adjusted until the meter 126 indicates that the potentiometer 101 has been tuned for channel 32. Once in the general range of channel 32, the potentiometer 101 may then be visually adjusted to attain the desired fine tuning characteristics of channel 32.

Figure 4:
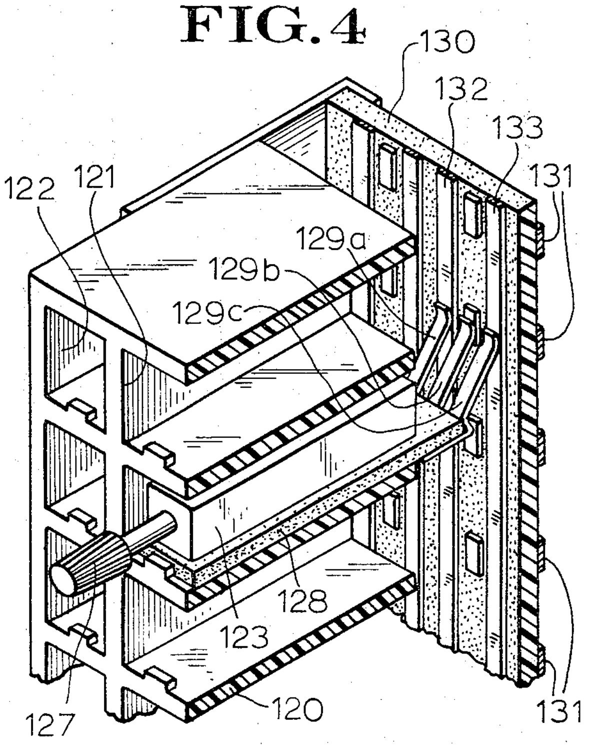
FIG. 4 is a fragmentary perspective view further illustrating certain mechanical features of the tuning arrangement and varactor driver circuit.

FIG. 4 illustrates in greater detail the electrical interconnection between the plug-in modules 123 containing potentiometers 101 (not shown) and the three sets of conductive elements comprising the varactor driver previously described in FIG. 1. The potentiometer 101 is mounted in the small rectangular plug-in modules 123 and adjusted by a knob 127 extending from the front of the module toward the viewer. The module 123 is itself mounted on a printed circuit board 128 such that three spring-type contacts 129*a*, 129*b* and 129*c* at the rear are coupled to the ends of the potentiometer 101 and its wiper arm 101*a*.

A printed circuit board 130 is mounted across the back of the grid forming, in effect, an end panel thereto. Thus, when a plug-in module 123 is inserted into its receptacle 122, the spring contacts 129*a*, 129*b*, 129*c* come into physical contact with the board 130. The three sets of conductors mentioned in connection with the varactor driver circuit of FIG. 1 are mounted on either side of the board. The first conductor set comprises horizontal conductive elements 131 on the back side of the board 130 while the second and third sets of conductors 132, 133, respectively, are laid out in the vertical direction on the front side of the board. Accordingly, if the board 130 were removed leaving only the conductors, the matrix array shown in FIG. 1 would be seen. The two outer spring contacts 129*a* and 129*c* of the module board 128, each connected to one end of the potentiometer, are positioned to contact the corresponding second conductor 132 and its associated parallel third conductor 133. The center spring contact 129*b* corresponds to the wiper arm and contacts a segmented conductive element 131 on the front of the board which passes through the board and connects with the first element on the back.

Accordingly, there has been shown a varactor driver circuit for developing a different unique voltage level for every channel in the VHF and UHF frequency bands and which is capable of generating additional control voltages for CATV channels. The viewer is able to select a particular channel by means of a dual control knob arrangement which couples the corresponding control voltage to a multi-band varactor tuning arrangement. The first knob, representative of the "tens" digit of the channel selected, and the second knob, representative of the "units" digit, provide exact-channel read-out means. Thus, any UHF channel may be selected in a manner identical to that utilized for VHF channel selection, thereby complying with the Federal Communications Commission requirements for "equal ease" tuning of the television receiver over the VHF and UHF frequency bands. Furthermore, any desired number of channels may be preselected to receive broadcast signals; it is not limited to just a few channels as were previous systems.

While a particular embodiment of the present invention has been shown and described, it will be obvious to those skilled in the art that various changes and modifications may be made without departing from the invention in its broader aspects. The aim in the appended claims is to cover all such changes and modifications as may fall within the true spirit and scope of the invention.

I claim:

1. In an all channel wave signal receiver having a varactor tuning system for receiving broadcast television channels in both the VHF and UHF spectrums, each said channel bearing a different numerical identification, a varactor driver circuit comprising in combination;

mechanical matrix means comprising an array of receptacles for electrically and physically defining all of said broadcast channels;

plug-in means insertable into said array of receptacles, each said plug-in means adjustably determining a control voltage representative of the particular broadcast channel corresponding to its receptable;

switch means selectively coupling a desired one of said receptacles to said varactor tuning system for applying the corresponding control voltage to said varactor tuning system;

and exact channel read-out means coupled to said switch means for identifying the particular broadcast channel selected by said switch means.

2. A varactor driver circuit in accordance with claim 1, wherein said mechanical matrix means includes first, second and third sets of electrical conductors, each of said first conductors defining a range of broadcast channels and each of said second conductors defining individual broadcast channels within those said ranges.

3. A varactor driver circuit in accordance with claim 2, wherein said switch means includes a first switch and a second switch, said first switch selectively coupling one of said second conductors to a first plane of reference potential while simultaneously coupling said associated third conductor to a second plane of reference potential and said second switch selectively coupling one of said first conductors to said varactor tuning system, said first and second switches being effective to address a particular receptacle, apply a differential operating potential to the said plug-in means inserted therein, and derive an adjustable control voltage therefrom that is unique to the particular broadcast channel selected.

4. A varactor driver circuit in accordance with claim 3, wherein said plug-in means comprises an adjustable voltage divider network for coupling said second conductor to its associated third conductor, the output of said voltage divider network being coupled to said first conductor, said plug-in means developing a unique control voltage only when said differential operating potential is applied thereacross.

5. A varactor driver circuit in accordance with claim 4, wherein said voltage divider network comprises a potentiometer, said potentiometer being adjustable to develop a control voltage effective to tune said varactor tuning system to a channel corresponding to the particular receptable in which said plug-in means is located.

6. A varactor driver circuit in accordance with claim 3, wherein said exact channel read-out means comprises first and second control knobs for respectively switching said first and second switches, said first control knob selecting a desired range and providing a visual read-out of the "tens" digit of the particular channel selected, said second control knob selecting the particular channel and providing a visual read-out of the "units" digit of the selected channel.

7. A varactor driver circuit in accordance with claim 6, wherein said first switch comprises at least two electrically independent switching sections operable from said first control knob, said first switching section coupling said second conductor to said first plane of reference potential and said second switching section coupling said third conductors to said second plane of reference potential.

8. A varactor driver circuit in accordance with claim 1, wherein said array of receptacles comprises several rows and columns in a rectangular configuration, the particular broadcast channel assigned to each receptacle being identifiable by its row and column designation; and wherein said channel numbers are coordinated with said row and column designations.

* * * * *